US006249436B1

(12) United States Patent   (10) Patent No.: US 6,249,436 B1
Bollesen                    (45) Date of Patent:    Jun. 19, 2001

(54) WIRE HEAT SINK ASSEMBLY AND METHOD OF ASSEMBLING

(75) Inventor: Vernon Bollesen, Milpitas, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/385,480

(22) Filed: Aug. 30, 1999

(51) Int. Cl.[7] ................................................. H05U 7/20
(52) U.S. Cl. ........................ 361/720; 361/704; 361/719; 257/718; 257/719; 24/457; 248/505
(58) Field of Search .................................. 361/704, 707, 361/709, 710, 715, 719–1, 721; 165/80.2, 80.3; 174/16.3; 257/706, 707, 712, 713, 718, 719–1, 722, 727

(56) References Cited

U.S. PATENT DOCUMENTS

| 4,716,494 | * | 12/1987 | Bright et al. | 165/80.3 |
| 4,972,294 | | 11/1990 | Moses, Jr. et al. | 361/386 |
| 5,077,638 | | 12/1991 | Andersson et al. | 361/388 |
| 5,208,731 | | 5/1993 | Blomquist | 361/386 |
| 5,253,702 | | 10/1993 | Davidson et al. | 165/80.4 |
| 5,276,585 | | 1/1994 | Smithers | 361/704 |
| 5,282,111 | * | 1/1994 | Hopfer | 361/704 |
| 5,307,239 | | 4/1994 | McCarty et al. | 361/704 |
| 5,329,426 | | 7/1994 | Villani | 361/719 |
| 5,329,993 | | 7/1994 | Ettehadieh | 165/104.14 |
| 5,343,362 | | 8/1994 | Solberg | 361/710 |
| 5,353,863 | * | 10/1994 | Yu | 165/80.3 |
| 5,367,193 | | 11/1994 | Malladi | 257/707 |
| 5,373,099 | | 12/1994 | Boitard et al. | 174/16.3 |
| 5,423,375 | | 6/1995 | Chiou | 165/80.3 |
| 5,570,271 | | 10/1996 | Lavochkin | 361/704 |
| 5,581,442 | * | 12/1996 | Morosas | 361/704 |
| 5,586,005 | | 12/1996 | Cipolla et al. | 361/719 |
| 5,621,244 | | 4/1997 | Lin | 257/713 |
| 5,699,229 | | 12/1997 | Brownell | 361/719 |
| 5,730,210 | * | 3/1998 | Kou | 361/704 |
| 5,748,446 | | 5/1998 | Feightner et al. | 361/709 |
| 5,761,041 | | 6/1998 | Hassanzadeh et al. | 361/704 |
| 5,847,928 | * | 12/1998 | Hinshaw et al. | 361/704 |
| 5,881,800 | | 3/1999 | Chung | 165/80.3 |
| 5,883,783 | * | 3/1999 | Torturro | 361/704 |
| 5,884,692 | | 3/1999 | Lee et al. | 165/80.3 |
| 5,917,700 | * | 6/1999 | Clemens et al. | 361/704 |
| 5,959,350 | | 9/1999 | Lee et al. | 257/712 |
| 5,991,151 | | 11/1999 | Capriz | 361/704 |
| 6,043,984 | * | 3/2000 | Tseng | 361/704 |
| 6,055,159 | * | 4/2000 | Sun | 361/704 |
| 6,101,091 | * | 8/2000 | Baik | 361/704 |

FOREIGN PATENT DOCUMENTS 2 184 887  *  7/1987 (GB) .

* cited by examiner

Primary Examiner—Leo P. Picard
Assistant Examiner—Boris L. Chervinsky
(74) Attorney, Agent, or Firm—Serge J. Hodgson; Gunnison, McKay & Hodgson, L.L.P.

(57) ABSTRACT

A heat sink assembly includes a heat sink, a circuit board and an integrated circuit package. The heat sink includes torque bars having locking features. The package is located between the heat sink and the circuit board and attached to a die attach area of the circuit board. A heat sink retainer has ends secured in the locking features of the torque bars. Tension in the retainer imparts torque on the heat sink which causes the heat sink to impart a downward force on the package. The retainer presses the heat sink down uniformly on the package. Further, the downward force applied by the heat sink to the package is countered by an equal upward force applied by a base section of the retainer on the circuit board. Since the base section is located directly opposite the die attach area, the upward force is transferred from the base section directly back to the heat sink without imparting any bending force on the circuit board.

20 Claims, 6 Drawing Sheets

WIRE HEAT SINK ASSEMBLY AND METHOD OF ASSEMBLING

FIELD OF THE INVENTION

The present invention relates generally to the packaging of electronic components in electronic devices. More particularly, the present invention relates to the removable attachment of a heat sink to an integrated circuit package mounted on a circuit board in an electronic device.

BACKGROUND OF THE INVENTION

As the art moves towards smaller higher power integrated circuits such as SRAMs, heat transfer from the integrated circuit package (IC package) becomes increasingly difficult and more important. As used herein, the term "IC package" includes the heat generating integrated circuit as well as the packaging surrounding the integrated circuit.

One conventional technique to remove heat from an IC package is to employ a finned heat sink which is placed in thermal contact with the IC package. In this manner, heat generated by the IC package is conducted to the heat sink and then dissipated to the ambient environment.

Of importance, the heat sink must be reliably attached to the IC package in a manner which does not undesirably stress or damage the IC package or the circuit board to which the IC package is connected. One conventional technique is to employ a thermally conductive adhesive which bonds the heat sink to the IC package. However, thermally conductive adhesives do not adhere well to plastic IC packages resulting in an unacceptably high incidence of bond failure between the plastic IC package and the heat sink. Further, once the heat sink is bonded with the thermally conductive adhesive, it is difficult to remove the heat sink from the IC package without causing damage to the IC package, the heat sink or the circuit board. Yet, it is desirable to have a removable heat sink to readily allow chip repair, rework and/or replacement. Accordingly, it is desirable to avoid the use of thermally conductive adhesives altogether.

One removable heat sink uses clips and/or fasteners to attach the heat sink directly to the IC package. However, when attached in this manner, the heat sink exerts undue force on the IC package which can damage and ultimately destroy the IC package. To avoid this problem, other removable heat sinks are attached directly to the circuit board to which the IC package is connected.

FIG. 1 is a side view of an electronic device 8 which includes a heat sink 10 directly attached by post type fastening members 12A to a circuit board 14 in accordance with the prior art. Located between heat sink 10 and circuit board 14 is an IC package 16 which generates heat during use. IC package 16 is typically electrically connected to circuit board 14 by one or more circuit interconnections, e.g., solder, which are not illustrated in FIG. 1 for purposes of clarity. Fastening members 12A urge heat sink 10 towards circuit board 14 and down onto IC package 16 to make the thermal contact between heat sink 10 and IC package 16.

Although providing the force necessary to make the thermal contact between heat sink 10 and IC package 16, fastening members 12A causes heat sink 10 to press unevenly on IC package 16. In particular, IC package 16 acts as a pivot between heat sink 10 and circuit board 14 so that end 10A of heat sink 10 is urged away from end 14A of circuit board 14 as indicated by arrows 18. This causes the force exerted by heat sink 10 on to IC package 16 to be greater at side 16A of IC package 16 than at side 16B. This uneven force distribution can damage and even crack IC package 16. Further, this uneven force distribution can create a gap between side 16B and heat sink 10 resulting in poor heat transfer between IC package 16 and heat sink 10. Alternatively, or in addition to, this uneven force distribution can cause circuit interconnection failure near side 16B of IC package 16. As those skilled in the art understand, these conditions can ultimately cause failure of device 8.

To avoid these drawbacks, it has become known in the art to attach both sides of heat sink 10 to circuit board 14. As an example, second post type fastening members 12B illustrated in dashed lines in FIG. 1 can be employed. This tends to equalize the force exerted by heat sink 10 on both sides 16A and 16B of IC package 16. However, this also causes the ends 14A, 14B of circuit board 14 to be pulled up by fastening members 12B, 12A, respectively, relative to the die attach region 14C of circuit board 14 to which IC package 16 is attached. This bending force, indicated by arrows 20, causes warpage of circuit board 14 such that circuit board 14 is displaced to a position 22. Over time, this warpage can cause device 8 to fail, e.g., from failure of circuit interconnections between IC package 16 and circuit board 14.

Accordingly, the art needs a heat sink assembly which results in even force application to the IC package and avoids circuit board warpage.

SUMMARY OF THE INVENTION

In accordance with the present invention, a heat sink assembly is presented. The heat sink assembly includes a heat sink, a circuit board and a package, the package including an electronic component such as an integrated circuit. The heat sink includes a plurality of torque bars and a plurality of locking features, where each torque bar of the plurality of torque bars has a different locking feature of the plurality of locking features. The package is located between the heat sink and the circuit board and attached to a die attach area of the circuit board.

The heat sink assembly further includes a heat sink retainer having a plurality of ends, each end of the plurality of ends being secured in a different locking feature of the plurality of locking features. Tension in the retainer imparts torque on the heat sink which causes the heat sink to impart a downward, e.g., first, force on the package. This downward force creates the thermal contact between the heat sink and the package.

Of importance, the retainer presses the heat sink down uniformly on the package. Thus, the heat sink assembly in accordance with the present invention avoids damage caused by the application of uneven force distribution on the package of conventional heat sink assemblies.

Further, the downward force applied to the package by the heat sink is countered by an equal upward, e.g., second, force applied by the base section of the retainer on the circuit board. Since the base section is located directly opposite the die attach area, the upward force is transferred from the base section directly back to the heat sink without imparting any bending force on the circuit board. In this manner, a heat sink assembly in accordance with the present invention avoids circuit board warpage and the associated ultimate device failure of conventional heat sink assemblies.

Further, the retainer is designed to pass through the circuit board at a distance from the die attach area. This allows greater utilization of the die attach area, e.g., allows more traces and/or vias to be located on or in the circuit board at the die attach area, compared to a case where a retainer passes through the die attach area.

In one embodiment, a heat sink retainer includes a plurality of ends, a base section and a plurality of spring elements, where each spring element of the plurality of spring elements integrally connects a different end of the plurality of ends to the base section. In accordance with this embodiment, the locking features of the heat sink are notches on the torque bars. The ends of the retainer are moved laterally away from the package to snap the ends into the notches thus securing the retainer to the heat sink. Of importance, tension in the retainer securely presses the ends into the notches.

Also in accordance with the present invention, a method of pressing a heat sink into thermal contact with a package is presented. The method includes attaching the package to a die attach area of a substrate such as a circuit board. The heat sink is positioned such that the package is located between the heat sink and the substrate. A plurality of ends of a retainer are attached to the heat sink, where the plurality of ends impart torque on the heat sink. This torque causes the heat sink to impart a downward force on the package.

The downward force on the package is countered by an opposite upward force applied by a base section of the retainer on the substrate directly opposite the die attach area.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

This application is related to Bollesen, co-filed application Ser. No. 09/385,159, now U.S. Pat. No. 6,125,037, herein incorporated by reference in its entirety.

In accordance with the present invention, a heat sink assembly is presented. The heat sink assembly (FIG. 2) includes a heat sink 112, a substrate 102, typically a circuit board, and at least one IC package 104. Each IC package 104 includes an electronic component such as an integrated circuit.

Figure 1:
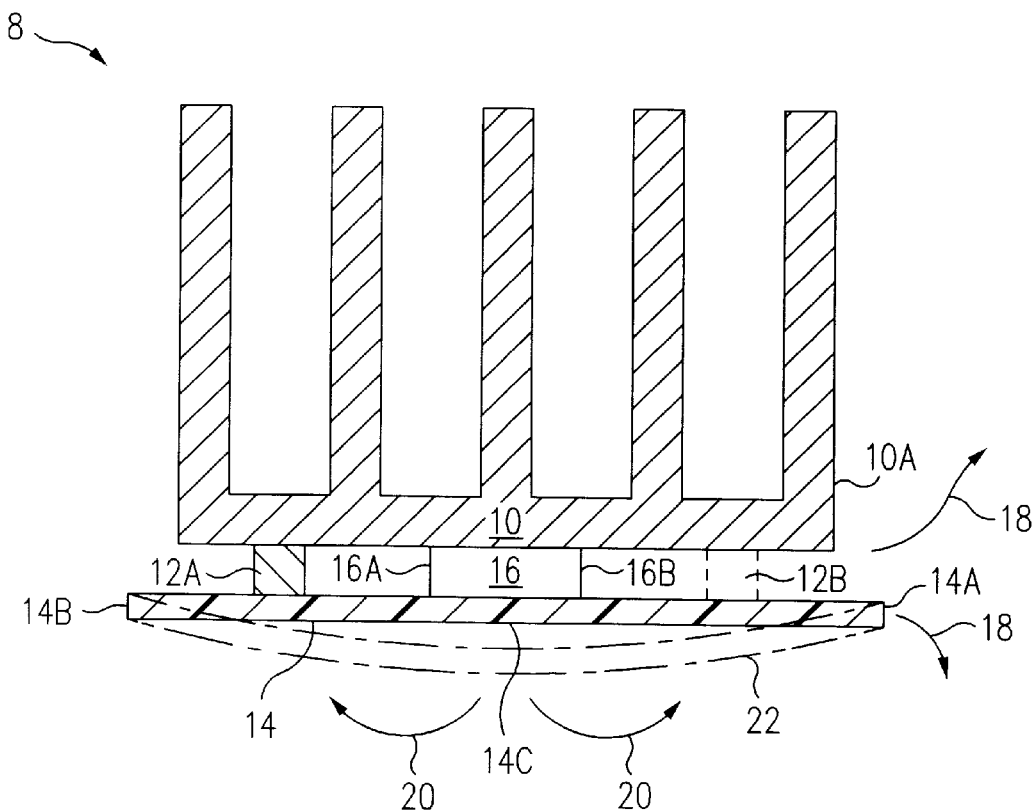
FIG. 1 is a side view of an electronic device which includes a heat sink directly attached by post type fastening members to a circuit board in accordance with the prior art.
Figure 2:
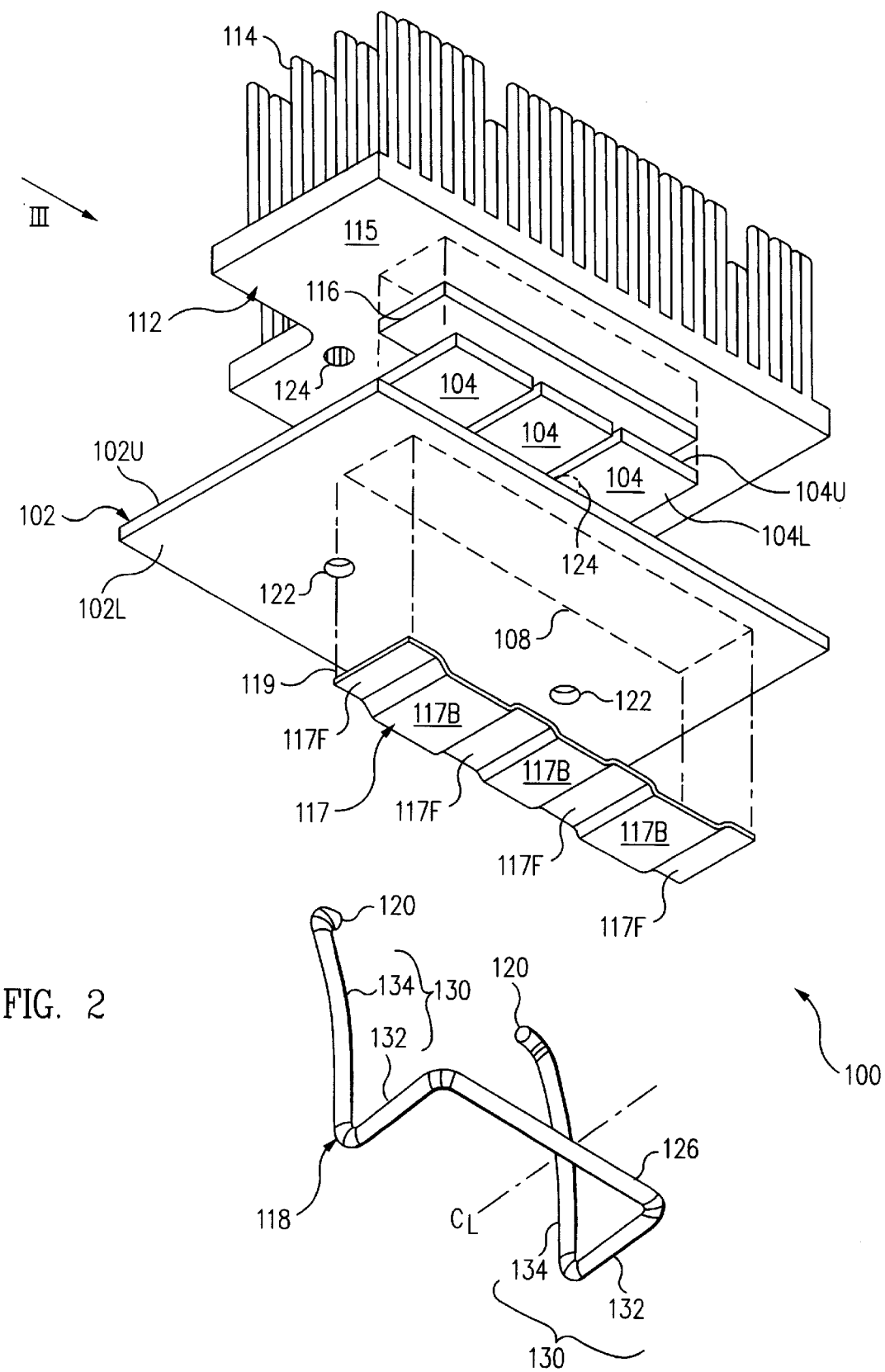
FIG. 2 is an exploded lower perspective view of an electronic device employing a heat sink assembly in accordance with the present invention.
Figure 4:
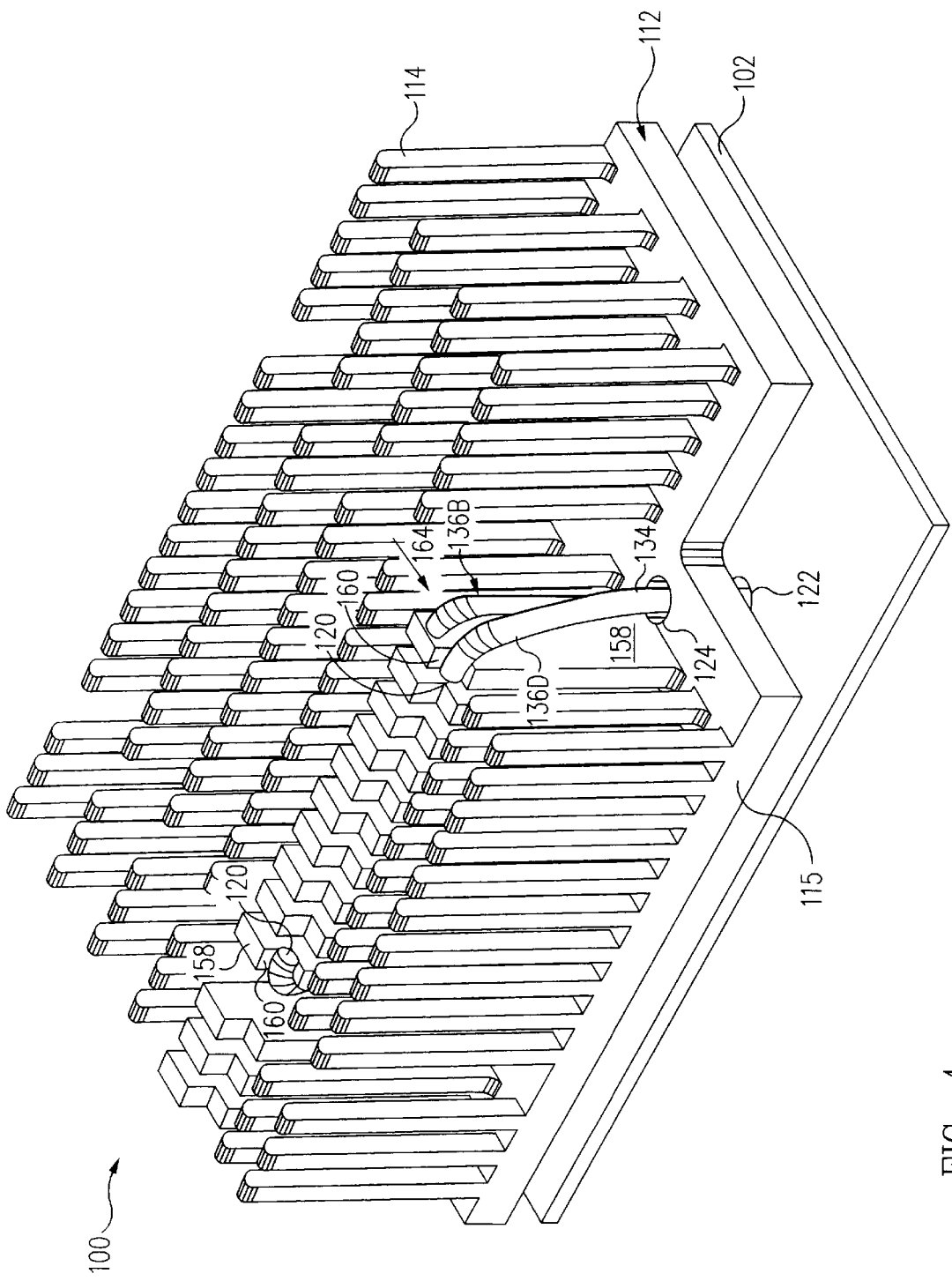
FIG. 4 is an upper perspective view of the electronic device of FIG. 2 illustrating the attachment of a retainer to a heat sink.

Referring to FIGS. 2, 4 together, heat sink 112 includes torque bars 158 and locking features 160, where each torque bar 158 has a locking feature 160. IC packages 104 are located between heat sink 112 and substrate 102 and attached to a die attach area 108 of substrate 102.

The heat sink assembly further includes a heat sink retainer 118 having heat sink latching ends 120, each heat sink latching end 120 being secured in a locking feature 160. Tension in retainer 118 imparts torque on heat sink 112 which, in turn, causes heat sink 112 to impart a downward, e.g., first, force on IC packages 104. This downward force creates the thermal contact between heat sink 112 and IC packages 104.

Of importance, retainer 118 presses heat sink 112 down uniformly on IC packages 104. Thus, the heat sink assembly in accordance with the present invention avoids damage caused by the application of uneven force distribution on the IC package of conventional heat sink assemblies.

Further, the downward force applied to IC packages 104 by heat sink 112 is countered by an equal upward, e.g., second, force applied by a base section 126 of retainer 118 on substrate 102 (via a standoff 117 and a protective pad 119). Since base section 126 is located directly opposite die attach area 108, the upward force is transferred from base section 126 directly back to heat sink 112 without imparting any bending force on substrate 102. In this manner, a heat sink assembly in accordance with the present invention avoids circuit board warpage and the associated ultimate device failure of conventional heat sink assemblies.

Further, retainer 118 is designed to pass through substrate 102 at a distance from die attach area 108. This allows greater utilization of die attach area 108, e.g., allows more traces and/or vias to be located on or in substrate 102 at die attach area 108, compared to a case where a retainer passes through die attach area 108.

In more detail, FIG. 2 is an exploded lower perspective view of an electronic device 100 employing a heat sink assembly in accordance with the present invention. Device 100 includes substrate 102 such as a printed circuit board (hereinafter referred to as circuit board 102). Attached to circuit board 102 are IC packages 104, i.e. a plurality of IC packages, which each include a heat generating electronic component such as an integrated circuit.

As shown in FIG. 2, lower surfaces 104L of IC packages 104 are attached to die attach area 108 of an upper surface 102U of circuit board 102. Generally, die attach area 108 includes the circuit board areas to which IC packages 104 are attached and also the immediate circuit board area around IC packages 104 including the circuit board area between adjacent ones of IC packages 104. IC packages 104 are attached typically by one or more circuit interconnection such as solder, solder balls, or pins, or by adhesive. Although three IC packages 104 are illustrated in FIG. 2, a different number of packages can be attached to die attach area 108, e.g., one, two, four or more. For simplicity, IC packages 104 are hereinafter collectively referred to as IC package 104.

In thermal contact with a heat transfer surface 104U of IC package 104 is heat sink 112 having a base 115 and fins 114 extending from base 115. Heat sink 112 is made of a material having a high thermal conductivity, e.g., is made of a metal such as aluminum or copper. Although fins 114 are illustrated in FIG. 2, other heat sink designs can also be used, e.g., solid heat sinks, plate type heat sinks and disk shaped heat sinks.

Typically, a thermal pad 116 such as an elastomer having a thermally conductive filler, e.g., aluminum oxide and/or boron nitride, is interposed between heat sink 112 and IC package 104. Thermal pad 116 is compliant thus compensating for any mismatch in physical characteristics and thermal expansion between heat sink 112 and IC package 104. Further, thermal pad 116 has a high thermal conductivity thus improving heat transfer between IC package 104 and heat sink 112 although, in an alternative embodiment, thermal pad 116 is not used and heat sink 112 directly contacts IC package 104.

Heat sink 112 is held in place and pressed into thermal contact with heat transfer surface 104U of IC package 104 by retainer 118. In this embodiment, retainer 118 is a wire having bent ends 120 which are used to attach retainer 118 to heat sink 112. Each of heat sink latching ends 120 pass through a corresponding one of apertures 122 in circuit board 102 and through a corresponding one of apertures 124 in base 115 of heat sink 112 to attach retainer 118 to heat sink 112.

A standoff 117 is located between base section 126 of retainer 118 and circuit board 102. Standoff 117 distributes upward force from base section 126 over a greater area of circuit board 102. Optionally, to protect circuit board 102 from standoff 117, a protective pad 119, e.g., a 0.010 inch MYLAR™ pad, is located between standoff 117 and circuit board 102 and more typically is attached to the upper surface of standoff 117. Although standoff 117 and protective pad 119 are illustrated in FIG. 2, use of standoff 117 and/or protective pad 119 is optional. For example, base section 126 can directly contact and press on circuit board 102. Generally, base section 126 supports circuit board 102.

As shown in FIG. 2, base section 126 of retainer 118 is integrally connected to heat sink latching ends 120 by spring elements 130. Spring elements 130 press heat sink latching ends 120 against heat sink 112. Each spring element 130 includes a lateral arm 132 and a riser arm 134 integrally connected together. Each lateral arm 132 is integrally connected to base section 126 and each riser arm 134 is integrally connected to a heat sink latching end 120, sometimes called a corresponding heat sink latching end 120. Generally, retainer 118 is symmetric around a centerline $C_L$.

Retainer 118 is made of a stiff flexible resilient material having a high spring rate. Thus retainer 118 has the ability to return to its original form, i.e. relaxed state, after being forced out of shape. For example, retainer 118 is made from full hard type 302 stainless steel wire or piano wire and has a diameter of 0.070 inches. Retainer 118 is typically integral, i.e. is a single piece, and is manufactured using well known techniques such as by bending a piece of wire.

Figure 3A:
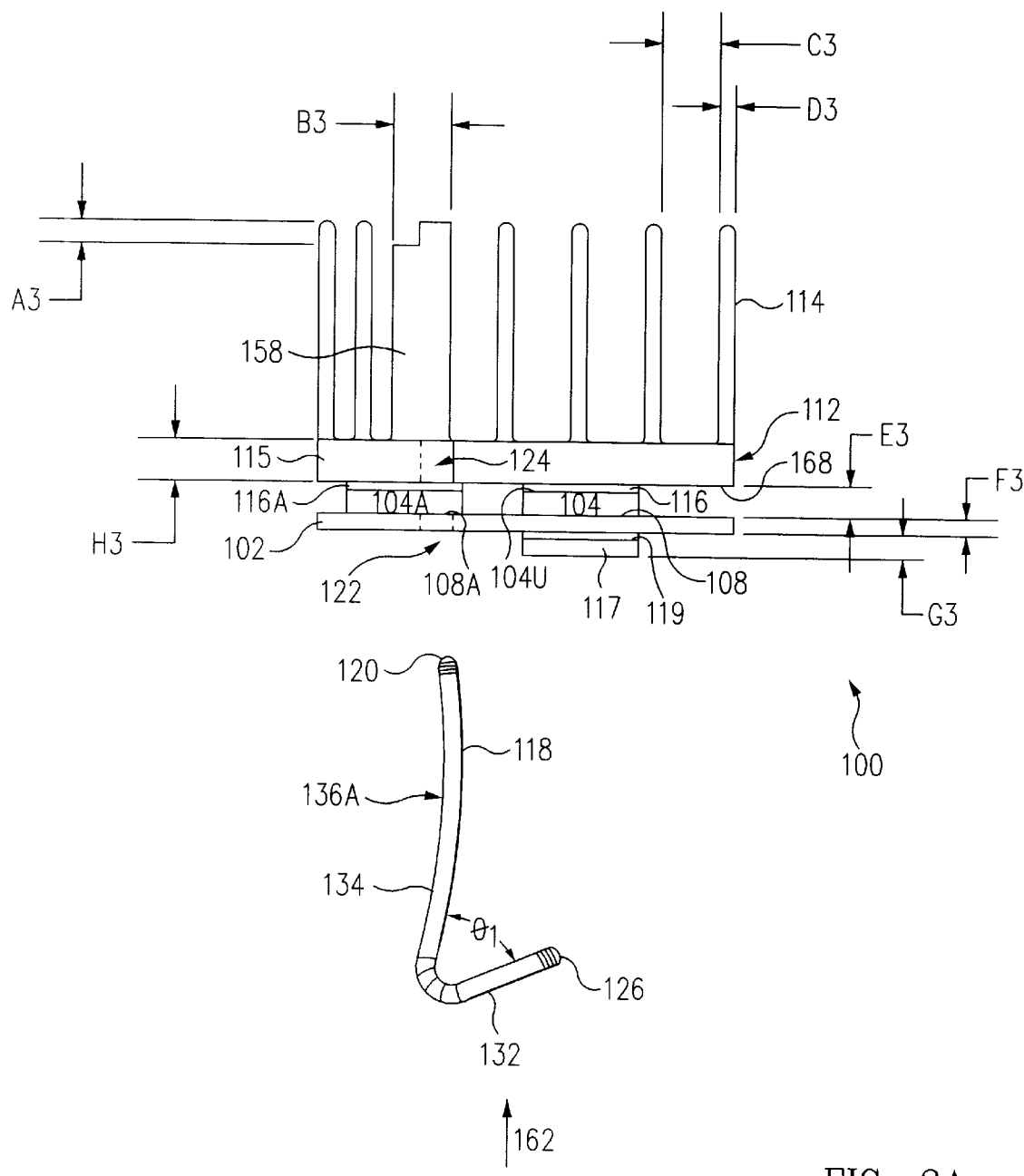
FIGS. 3A, 3B are side views of the electronic device from the line III of FIG. 2.

FIG. 3A is a side view of device 100 from the line III of FIG. 2. Referring now to FIG. 3A, to clip heat sink 112 into place, heat sink 112 is positioned above circuit board 102 such that IC package 104 and thermal pad 116 are located between heat sink 112 and circuit board 102. In the embodiment illustrated in FIGS. 3A, 3B, heat sink 112 is positioned such that one or more additional IC packages 104A and thermal pad 116A are also located between heat sink 112 and circuit board 102. (In one embodiment, thermal pad 116A and thermal pad 116 are the same thermal pad.) IC packages 104A are attached to a second die attach area 108A, e.g., located between apertures 122 in circuit board 122. Although illustrated in FIGS. 3A, 3B, IC packages 104A and thermal pad 116A are optional and in an alternative embodiment are not used.

Each of apertures 124 in heat sink 112 are substantially aligned with a different one of apertures 122 in circuit board 102. Thus, for each aperture 124 in heat sink 112 there is a corresponding aperture 122 in circuit board 102. Standoff 117 (and optionally protective pad 119) is (are) positioned below circuit board 102 directly opposite die attach area 108. Initially, retainer 118 is positioned in a relaxed state such that each heat sink latching end 120 is aligned directly below an aperture 122, sometimes called a corresponding aperture 122, in circuit board 102 as shown in FIG. 3A.

In a relaxed state, retainer 118 is unstressed. In this state, an angle $\theta_1$ between lateral arm 132 and riser arm 134 exists. Illustratively, angle $\theta_1$ is generally less than 90 degrees, typically is in the approximate range of 40 to 70 degrees, and in one embodiment is in the approximately range of 55 to 57 degrees.

To secure heat sink 112 into place with retainer 118, retainer 118 is pressed towards circuit board 102 as shown by the arrow 162. More particularly, heat sink latching ends 120 are pressed through corresponding apertures 122 in circuit board 102. It may be necessary to spread heat sink latching ends 120 apart from one another to allow heat sink latching ends 120 to pass through apertures 122.

While holding heat sink 112 in place, heat sink latching ends 120 are then pressed through apertures 124 in heat sink 112. Typically, heat sink latching ends 120 are spread apart from one another to allow heat sink latching ends 120 to pass through apertures 124. Retainer 118 is pressed upwards so that base section 126 continues to move towards circuit board 102 until base section 126 contacts, and is prevented from moving further by, standoff 117.

Figure 3B:
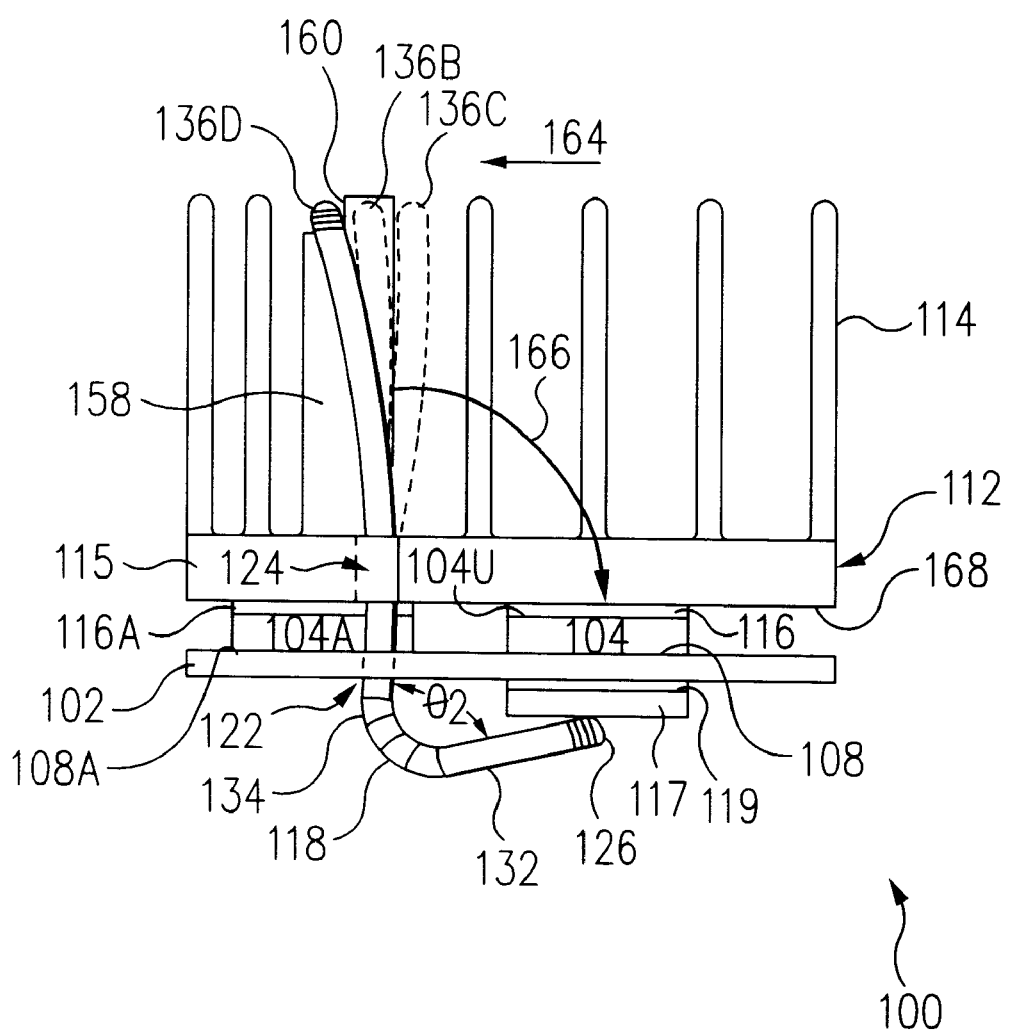

FIGS. 3B, 4 are side and upper perspective views, respectively, of device 100 illustrating the attachment of retainer 118 to heat sink 112 in accordance with the present invention. Referring now to FIGS. 3B and 4 together, heat sink 112 includes torque bars 158 extending from base 115, each torque bar 158 being adjacent an aperture 124. Each torque bar 158 includes a notch 160 opposite base 115. Notches 160 are locking features which secure heat sink latching ends 120 to heat sink 112. As discussed in detail below, by locating notches 160 at a predefined distance from base 115, force applied by heat sink latching ends 120 on notches 160 is transferred to heat sink 112 which, in turn, applies force uniformly downwards on IC package 104. Although rectangular torque bars 158 are illustrated, it is understood that other torque bars can be used. For example, torque bars 158 can be cylindrical. Further, although rectangular notches 160 as the locking features are illustrated, it is understood that other locking features such as rectangular or circular apertures in torque bars 158 can be used.

Returning to the attachment of retainer 118, after passing heat sink latching ends 120 through apertures 124 in heat sink 112, retainer 118 is located at a position 136B. At position 136B, heat sink latching ends 120 are pressing towards one another against respective torque bars 158 of heat sink 112. Heat sink latching ends 120 press towards one another because heat sink latching ends 120 are spread apart from one another relative to the relaxed state of retainer 118, e.g., heat sink latching ends 120 were spread apart from one another to pass through apertures 124.

Alternatively, as shown in FIG. 3B, after passing heat sink latching ends 120 through apertures 124 in heat sink 112, retainer 118 is located at a position 136C. (Position 136C is not shown in FIG. 4 for clarity.) At position 136C, heat sink latching ends 120 are located laterally adjacent torque bars 158 towards IC package 104. In this alternative, heat sink latching ends 120 are spread apart from one another and pressed in the direction of arrow 164 to move retainer 118 to position 136B.

In either alternative, referring again to FIGS. 3B, 4 together, retainer 118 is moved from position 136B by moving heat sink latching ends 120 laterally away from IC package 104 in the direction of arrow 164. At the same time, lateral arms 132 are typically pressed towards circuit board 102 to move heat sink latching ends 120 vertically up. Upon reaching notches 160 of torque bars 158, heat sink latching ends 120 snap towards one another and into notches 160 thus securing retainer 118 to heat sink 112. Of importance, tension in retainer 118 created when heat sink latching ends 120 were spread apart securely presses heat sink latching ends 120 into notches 160.

At this point, retainer 118 is located at a position 136D. Referring again to FIG. 3B, at position 136D, the angle between lateral arm 132 and riser arm 134 is angle $\theta_2$, where angle $\theta_2$ is greater than angle $\theta_1$ between these elements when retainer 118 is in a relaxed state. For example, angle $\theta_2$ is in the approximate range of 70 to 80 degrees, and in one embodiment is approximately 75 degrees. In addition, riser arms 134 are bent away from base section 126 compared to when retainer 118 is in a relaxed state.

As a result of spring elements 130 being bent out of shape, retainer 118 is in tension. In particular, as a result of the bending of riser arms 134 and the change in the angle between lateral arms 132 and riser arms 134 from angle $\theta_1$ to angle $\theta_2$, retainer 118 is in tension. This tension causes heat sink latching ends 120 to press against notches 160 laterally towards IC package 104 in the direction opposite arrow 164. At the same time, this tension causes heat sink latching ends 120 to press against notches 160 downward towards circuit board 102.

In this manner, heat sink latching ends 120 impart torque on heat sink 112 which tends to twist heat sink 112 as indicated by the arrow 166 in FIG. 3B. As a result, heat sink 112 presses vertically down towards IC package 104. More particularly, heat sink 112 presses vertically down on thermal pad 116 which presses vertically down on IC package 104 thus creating the thermal contact between IC package 104 and heat sink 112. Illustratively, the total downward force exerted by heat sink 112 on IC package 104 is approximately 15 lb.

Of importance, heat sink 112 presses down uniformly on IC package 104 (and on IC package 104A if used). This is because spring elements 130 of retainer 118 are symmetrically displaced and thus each impart equal torque on heat sink 112. This is also because lower surface 168 of heat sink 112 is substantially parallel to circuit board 102 and heat transfer surface 104U of IC package 104. Thus, a heat sink assembly in accordance with the present invention avoids the application of uneven force distribution on the IC package and the associated damage and ultimate device failure of conventional heat sink assemblies.

Of further importance, retainer 118 passes through circuit board 102 at a distance from die attach area 108. More particularly, riser arms 134 pass through apertures 122 which are located at a distance from die attach area 108. In one embodiment, the center of each aperture 122 is located approximately 3 millimeters from IC package 104. However, in light of this disclosure it is understood that 3 millimeters is only illustrative and that apertures 122 can be closer to, or further from, die attach area 108 and IC package 104. Locating apertures 122 at a distance from die attach area 108 allows greater utilization of die attach area 108, e.g., allows more traces and/or vias to be located on or in circuit board 102 at die attach area 108, compared to having apertures 122 in die attach area 108.

The vertical downward force, e.g., first force, applied on IC package 104 (and on IC package 104A if used) by heat sink 112 is countered by an equal vertical upward force, e.g., second force, applied by base section 126 of retainer 118 on circuit board 102 (via standoff 117 and protective pad 119) directly opposite IC package 104. As best seen in FIG. 3B, base section 126 is located adjacent circuit board 102 directly opposite from die attach area 108. Thus, the vertical upward force is transferred from base section 126 directly back to heat sink 112 through standoff 117, protective pad 119, circuit board 102, IC package 104 and thermal pad 116 without imparting any bending force on circuit board 102. To the extent any bending force is applied to circuit board 102, this bending force is not significant, i.e., does not cause warpage of circuit board 102. In this manner, a heat sink assembly in accordance with the present invention avoids circuit board warpage and the associated ultimate device failure of conventional heat sink assemblies.

Further, by sizing standoff 117 to be essentially the shape of IC package 104 and locating base section 126 directly opposite IC package 104, equal force distribution from base section 126 to IC package 104 is assured. For example, referring again to FIG. 2, a single IC package 104 can be located on upper surface 102U of circuit board 102 directly opposite each foundation section 117F of standoff 117, i.e., for a total of four IC packages 104 (instead of the three IC packages 104 illustrated). Further, bridge sections 117B can be used to pass over electronic components such as capacitors (not shown) extending down from a lower surface 102L of circuit board 102.

Heat sink 112 is also readily removed. To remove heat sink 112, heat sink latching ends 120 are pulled apart from one another and out of notches 160. Tension in retainer 118 then causes retainer 118 to move to position 136B or position 136C depending upon the shape of retainer 118 in its relaxed state. Retainer 118 is then moved down so that heat sink latching ends 120 pass back through and out of apertures 124 in heat sink 112. Heat sink 112 is then removed.

Illustrative specifications for the various characteristics shown in FIG. 3A are provided below in Table 1.

TABLE 1

| Characteristic | Specification | Units |
| --- | --- | --- |
| A3 | 0.098 square | inches |
| B3 | 0.245 ± 0.015 | inches |
| C3 | 3 × 0.220 | inches |
| D3 | 6 × 0.065 | inches |
| E3 | 0.135 ± 0.015 | inches |
| F3 | 0.062 ± 0.015 | inches |
| G3 | 0.101 ± 0.015 | inches |
| H3 | 0.150 ± 0.015 | inches |

Figure 5:
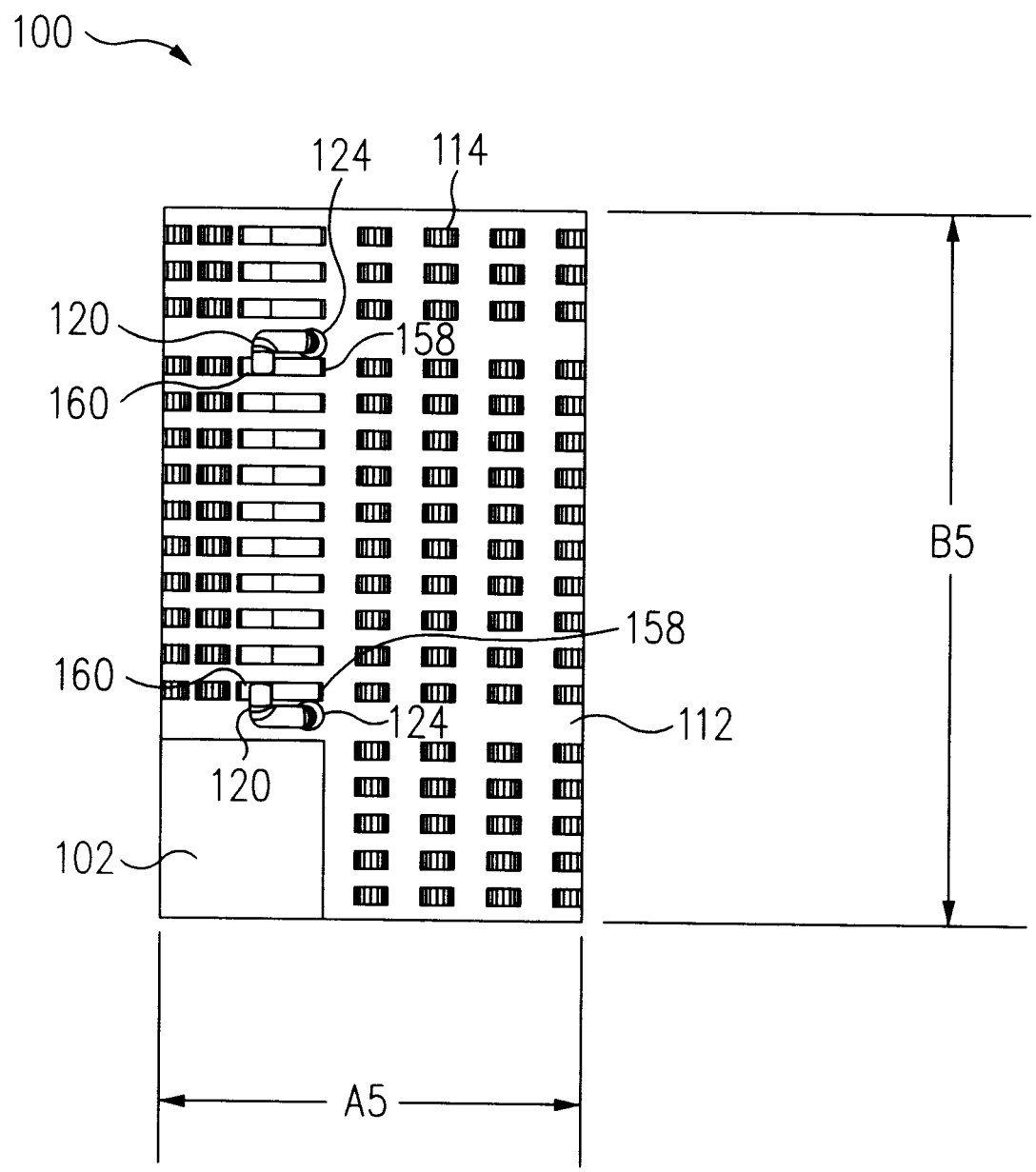
FIG. 5 is a top plan view of the electronic device of FIG. 2.

FIG. 5 is a top plan view of device 100. Illustrative specifications for the various characteristics shown in FIG. 5 are provided below in Table 2.

TABLE 2

| Characteristic | Specification | Units |
| --- | --- | --- |
| A5 | 1.694 ± 0.015 | inches |
| B5 | 2.923 ± 0.015 | inches |

The drawings and the forgoing description gave examples of the present invention. The scope of the present invention, however, is by no means limited by these specific examples. Numerous variations, whether explicitly given in the specification, such as differences in structure, dimension, and use of material, are possible. The scope of the invention is at least as broad as given by the following claims.

I claim:

1. A structure comprising:
   a heat sink comprising:
      a base having a plurality of aperture;
      a plurality of torque bars extending from said base, each torque bar of said plurality of torque bars being adjacent an aperture of said plurality of apertures; and a plurality of locking features, wherein each torque bar of said plurality of torque bars has a locking feature of said plurality of locking features;

a circuit board comprising a plurality of apertures;

a package comprising an electronic component; wherein said package is located between said heat sink and said circuit board and attached to a die attach area of said circuit board; and a retainer having a plurality of spring elements and a plurality of ends, each spring element of said plurality of spring elements passing through an aperture of said plurality of apertures in said circuit board and also through an aperture of said plurality of apertures in said base of said heat sink, wherein each end of said plurality of ends is secured in a locking feature of said plurality of locking features, wherein tension in said retainer imparts torque on said heat sink which causes said heat sink to impart a first force on said package, said first force being countered by a second force applied by a base section of said retainer on said circuit board directly opposite said die attach area.

2. The structure of claim 1 wherein said retainer passes through said circuit board at a distance from said die attach area.

3. A structure comprising:
    a retainer comprising:
        a plurality of ends;
        a base section; and
        a plurality of spring elements, wherein each spring element of said plurality of spring elements integrally connects an end of said plurality of ends to said base section; and
    a heat sink comprising:
        a base comprising a plurality of apertures; and
        a plurality of torque bars extending from said base, each torque bar of said plurality of torque bars being adjacent an aperture of said plurality of apertures and comprising a locking feature of a plurality of locking features, said plurality of locking features securing said plurality of ends to said heat sink.

4. The structure of claim 3 wherein each locking feature of said plurality of locking features is a notch in a torque bar of said plurality of torque bars.

5. The structure of claim 4 wherein each end of said plurality of ends snaps into a notch of said plurality of notches to secure said retainer to said heat sink.

6. The structure of claim 3 wherein tension in said retainer presses each end of said plurality of ends into a locking feature of said plurality of locking features.

7. The structure of claim 6 further comprising:
    a substrate; and
    a package comprising an electronic component, said package being located between said heat sink and said substrate, wherein said retainer presses said heat sink towards said package without imparting a bending force on said substrate.

8. The structure of claim 3 further comprising a substrate, wherein each spring element of said plurality of spring elements passes through an aperture of a plurality of apertures in said substrate.

9. The structure of claim 8 further comprising a package comprising an electronic component, said package located between said heat sink and said substrate.

10. The structure of claim 9 wherein said package is attached to a die attach area of said substrate, said base section being located adjacent said substrate directly opposite said die attach area.

11. The structure of claim 10 further comprising a standoff located between said base section and said substrate.

12. The structure of claim 10 wherein each aperture of said plurality of apertures in said substrate are located at a distance from said die attach area.

13. The structure of claim 3 wherein said retainer is symmetric around a center line of said retainer.

14. The structure of claim 3 wherein said said retainer has the ability to return to its original form after being bent out of shape.

15. A structure comprising:
    a heat sink having a plurality of torque bars and a plurality of locking features, wherein each torque bar of said plurality of torque bars has a locking feature of said plurality of locking features;
    a circuit board;
    a package comprising an electronic component; wherein said package is located between said heat sink and said circuit board and attached to a die attach area of said circuit board; and
    a retainer having a plurality of ends, wherein each end of said plurality of ends is secured in a locking feature of said plurality of locking features, said plurality of ends pressing said plurality of locking features in a first direction towards said package and in a second direction towards said circuit board, wherein tension in said retainer imparts torque on said heat sink which causes said heat sink to impart a first force on said package, said first force being countered by a second force applied by a base section of said retainer on said circuit board directly opposite said die attach area.

16. A method of pressing a heat sink into thermal contact with a package comprising an electronic component, said method comprising:
    attaching said package to a die attach area of a substrate;
    positioning said heat sink such that said package is located between said heat sink and said substrate; and
    attaching a first end of a retainer to a locking feature of a first torque bar of said heat sink and a second end of said retainer to a locking feature of a second torque bar of said heat sink, said first end pressing said first locking feature in a first direction towards said package and in a second direction towards said substrate, said second end pressing said second locking feature in said first direction towards said package and in said second direction towards said substrate, wherein said first and second ends impart torque on said heat sink which causes said heat sink to impart a first force on said package, said first force being countered by a second force applied by a base section of said retainer on said substrate directly opposite said die attach area.

17. The method of claim 16 wherein said first force and said second force are applied without imparting a bending force to said substrate.

18. The method of claim 16 wherein said attaching comprises snapping said first end into said first locking feature and snapping said second end into said second locking feature.

19. The method of claim 18 wherein said attaching further comprises moving said first end away from said package and to said first locking feature and said second end away from said package to said second locking feature.

20. A method of pressing a heat sink into thermal contact with a package comprising an electronic component, said method comprising:
    attaching said package to a die attach area of a substrate;

positioning said heat sink such that said package is located between said heat sink and said substrate, said heat sink comprises a plurality of torque bars and a plurality of locking feature, wherein each torque bar of said plurality of torque bars has a locking feature of said plurality of locking features;

spreading a plurality of ends of a retainer apart from one another; and attaching said plurality of ends of said retainer to said heat sink by snapping each end of said plurality of ends into a locking feature of said plurality of locking features, said plurality of ends pressing said plurality of locking features in a first direction towards said package and in a second direction towards said substrate, wherein said plurality of ends impart torque on said heat sink which causes said heat sink to impart a first force on said package, said first force being countered by a second force applied by a base section of said retainer on said substrate directly opposite said die attach area.

* * * * *